United States Patent
Zheng et al.

(10) Patent No.: US 9,415,999 B2
(45) Date of Patent: Aug. 16, 2016

(54) SEMICONDUCTOR DEVICE AND METHOD OF MANUFACTURING THE SAME

(71) Applicant: Semiconductor Manufacturing International (Shanghai) Corporation, Shanghai (CN)

(72) Inventors: Chao Zheng, Shanghai (CN); Wei Wang, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/738,582

(22) Filed: Jun. 12, 2015

(65) Prior Publication Data

US 2016/0031705 A1 Feb. 4, 2016

(30) Foreign Application Priority Data

Jul. 30, 2014 (CN) .......................... 2014 1 0370667

(51) Int. Cl.
*B81B 7/00* (2006.01)

(52) U.S. Cl.
CPC .................................... *B81B 7/0038* (2013.01)

(58) Field of Classification Search
CPC ................ H04L 47/822; H04L 47/827; H01L 2924/1461; H01L 2924/3025; H01L 28/10; H01L 21/50; B81B 7/0038; B81B 7/02; B81B 7/0064; B81C 1/00285; B81C 1/00269; B81C 1/00476; B81C 1/0015
See application file for complete search history.

(56) References Cited

U.S. PATENT DOCUMENTS

| | | | |
|---|---|---|---|
| 6,917,086 B2 * | 7/2005 | Cunningham | B81B 3/0024 200/181 |
| 8,952,856 B2 * | 2/2015 | Akiba | H01Q 9/00 343/700 MS |
| 9,169,116 B2 * | 10/2015 | Classen | B81B 3/0018 |

OTHER PUBLICATIONS

Choong-Sik Kim et al., "Fabrication of High Frequency DC-DC Converter Using Ti/FeTaN Film Inductor", IEEE Transactions on Magnetics, vol. 3, No. 4, Jul. 2001, pp. 2894-2896.

* cited by examiner

*Primary Examiner* — Nikolay Yushin
(74) *Attorney, Agent, or Firm* — Innovation Counsel LLP (57) ABSTRACT

A semiconductor device includes a bottom substrate, wherein a front-end device including a microelectromechanical systems (MEMS) device and an inductor is disposed on the bottom substrate, and a top substrate bonded to the bottom substrate so as form a cavity enclosing the front-end device. The semiconductor device further includes an adsorption layer disposed on a portion of the top substrate facing the front-end device, wherein the adsorption layer and the inductor do not overlap in a vertical direction.

14 Claims, 6 Drawing Sheets

SEMICONDUCTOR DEVICE AND METHOD OF MANUFACTURING THE SAME

CROSS-REFERENCE TO RELATED APPLICATION

This application claims priority to Chinese Patent Application No. 201410370667.0 filed Jul. 30, 2014, the disclosure of which is incorporated herein by reference in its entirety.

BACKGROUND

1. Technical Field

The present disclosure generally relates to the field of semiconductor technology, and more particularly to a semiconductor device and a method of manufacturing the same.

2. Description of the Related Art

In the field of semiconductor technology, microelectromechanical systems (MEMS) have numerous advantages and are widely used. Some applications may require semiconductor devices including MEMS devices to be operated in a hermetic environment. Those semiconductor devices may further include an inductor. In some instances, coupling effects between the inductor and other elements in the semiconductor devices may reduce a quality factor (Q-factor) of the inductor, thereby affecting the stability and yield of the semiconductor device.

SUMMARY

The present disclosure addresses at least the above deficiencies in the prior art. According to an embodiment of the inventive concept, a semiconductor device is provided. The semiconductor device includes: a bottom substrate, wherein a front-end device including a microelectromechanical systems (MEMS) device and an inductor is disposed on the bottom substrate; and a top substrate bonded to the bottom substrate so as form a cavity enclosing the front-end device, wherein the semiconductor device further includes an adsorption layer disposed on a portion of the top substrate facing the front-end device, and wherein the adsorption layer and the inductor do not overlap in a vertical direction.

In some embodiments, a trench may be formed in the top substrate facing the front-end device, the trench may constitute a part of the cavity, and wherein the adsorption layer may be disposed on a portion of a bottom surface of the trench.

In some embodiments, the adsorption layer may be further disposed on a sidewall of the trench.

In some embodiments, the adsorption layer may include titanium.

In some embodiments, the front-end device may further include an application specific integrated circuit (ASIC).

According to another embodiment of the inventive concept, a method of manufacturing a semiconductor device is provided. The method includes: providing a top substrate, wherein the top substrate is configured to be bonded to a bottom substrate, and wherein the bottom substrate comprises a front-end device including a microelectromechanical systems (MEMS) device and an inductor; etching the top substrate to form a trench in the top substrate, wherein the trench is disposed in a location corresponding to the front-end device; forming a mask over the top substrate including the trench, wherein an opening in the mask exposes a portion of the trench; forming an adsorption material layer covering the mask and the exposed portion of the trench; removing the mask, and a portion of the adsorption material layer covering the mask, so as to form an adsorption layer on a surface of the trench; and bonding the top substrate to the bottom substrate so as form a cavity enclosing the front-end device including the MEMS device and the inductor, wherein the adsorption layer and the inductor do not overlap in a vertical direction.

In some embodiments, etching the top substrate to form the trench in the top substrate may further include: forming a hard mask layer on the top substrate, a bonding material layer on the hard mask layer, and a first mask on the bonding material layer; etching the bonding material layer using the first mask to form a bonding layer; removing the first mask; forming a second mask covering the bonding layer; etching the hard mask layer using the second mask, so as to remove portions of the hard mask layer that are not covered by the second mask; etching the top substrate using the second mask to form the trench in the top substrate; and removing the second mask.

In some embodiments, the bonding material layer may include germanium and the hard mask layer may include silicon oxide.

In some embodiments, the mask may include a photoresist.

In some embodiments, the absorption layer may include titanium.

In some embodiments, the adsorption layer may be formed on a portion of a bottom surface of the trench.

In some embodiments, the adsorption layer may be further formed on a sidewall of the trench.

In some embodiments, the mask, and the portion of the adsorption material layer covering the mask, may be removed using a lift-off process.

According to a further embodiment of the inventive concept, an electronic apparatus is provided. The electronic apparatus includes: a semiconductor device and at least one electronic component connected to the semiconductor device. The semiconductor device includes: a bottom substrate, wherein a front-end device including a microelectromechanical systems (MEMS) device and an inductor is disposed on the bottom substrate; and a top substrate bonded to the bottom substrate so as form a cavity enclosing the front-end device, wherein the semiconductor device further includes an adsorption layer disposed on a portion of the top substrate facing the front-end device, and wherein the adsorption layer and the inductor do not overlap in a vertical direction.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale. In the drawings, the size and/or relative sizes of layers and regions may be exaggerated for clarity. Like reference numerals denote the same elements throughout.

Ordinary skill in the relevant art known techniques, methods and apparatus may not be discussed in detail, but in the application of these techniques, methods and apparatus, these techniques, methods and apparatus should be considered as part of this specification.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It should be understood that when an element or layer is referred to as "in", "on", "adjacent to", "connected to", or "coupled to" another element or layer, it can be directly on the other element or layer, adjacent, connected or coupled to the other element or layer, or with one or more intervening elements or layers being present. In contrast, when an element is referred to as being "directly on," "directly adjacent with", "directly connected to" or "directly coupled to" another element or layer, no intervening elements or layers are present.

It will be understood that, although the terms "first," "second," "third," etc. may be used herein to describe various elements, the elements should not be limited by those terms. Instead, those terms are merely used to distinguish one element from another. Thus, a "first" element discussed below could be termed a "second "element without departing from the teachings of the present inventive concept. As used herein, the term "and/or" includes any and all combinations of one or more of the associated listed items.

Spatially relative terms, such as "below," "lower," "under," "above," "upper" and the like, may be used herein to describe the spatial relationship of one element or feature to another element(s) or feature(s) as illustrated in the figures. It will be understood that the spatially relative terms are intended to encompass different orientations of the device during use or operation, in addition to the orientation depicted in the figures. For example, if the device in the figures is turned over, elements described as "below" or "beneath" relative to other elements or features would then be oriented "above" relative to the other elements or features. Thus, the example term "below" can encompass both an orientation of above and below, depending on the orientation of the elements. The device may be otherwise oriented (rotated 90 degrees or at other orientations) and the spatially relative descriptors used herein interpreted accordingly.

The inventive concept will be herein described with reference to cross-sections of intermediate and final structures of different embodiments. The cross-sections are merely illustrative and are not drawn to scale. Furthermore, it should be noted that the shapes of the intermediate and final structures may vary due to different tolerances in manufacturing. As such, the inventive concept is not limited to the embodiments illustrated in the drawings, but may further include variations in shapes as a result of different manufacturing tolerances. For example, an implanted region (depicted as a rectangle in the drawings) may have generally rounded or curved edges depending on the gradient in the ion implant concentration. Therefore, the areas/shapes illustrated in the figures are merely schematic, and should not be construed to limit the inventive concept.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

It should be understood that the inventive concept is not limited to the embodiments described herein. Rather, the inventive concept may be modified in different ways to realize different embodiments.

Figure 1A:
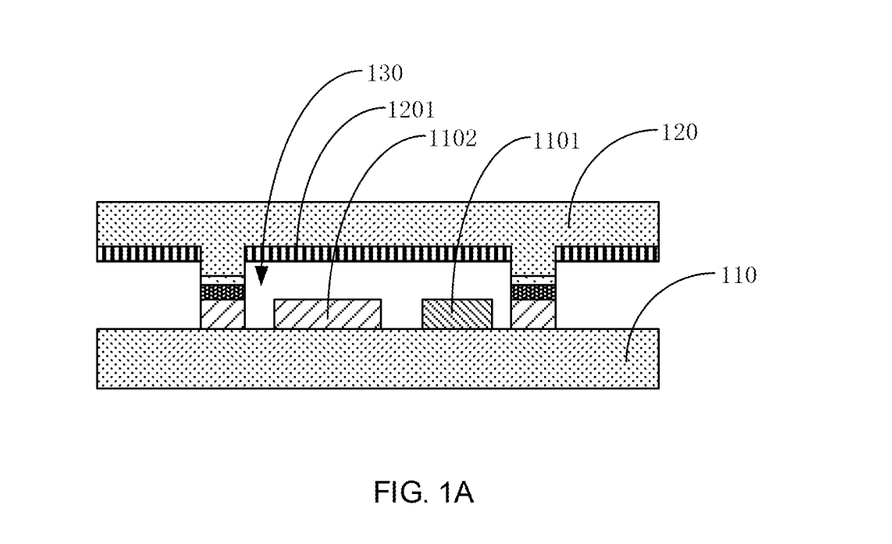
FIG. 1A is a cross-sectional view of a semiconductor device.

FIG. 1A is a cross-sectional view of a semiconductor device including a MEMS device. The MEMS device may be operated in a vacuum-like or hermetic environment.

Referring to FIG. 1A, a MEMS device 1101 and an inductor 1102 are disposed on a bottom substrate 110. The MEMS device 1101 and an inductor 1102 collectively constitute a front-end device. In some embodiments, the front-end device may include the MEMS device 1101, the inductor 1102, as well as other components. The bottom substrate 110 and a top substrate 120 are bonded together to form a cavity 130, that the front-end device including the MEMS device 1101 and the inductor 1102 is disposed in the cavity 130.

To ensure that the cavity 130 is in a vacuum-like state, an adsorption layer 1201 is disposed on the top substrate 120 within the cavity 130 facing the front-end device, so as to absorb gases that may be released by the bottom/top substrates 110/120. Thus, the cavity 130 provides a sealed packaging environment for the front-end device. As shown in FIG. 1A, the adsorption layer 1201 completely overlaps the front-end device including the MEMS device 1101 and the inductor 1102.

Figure 1B:
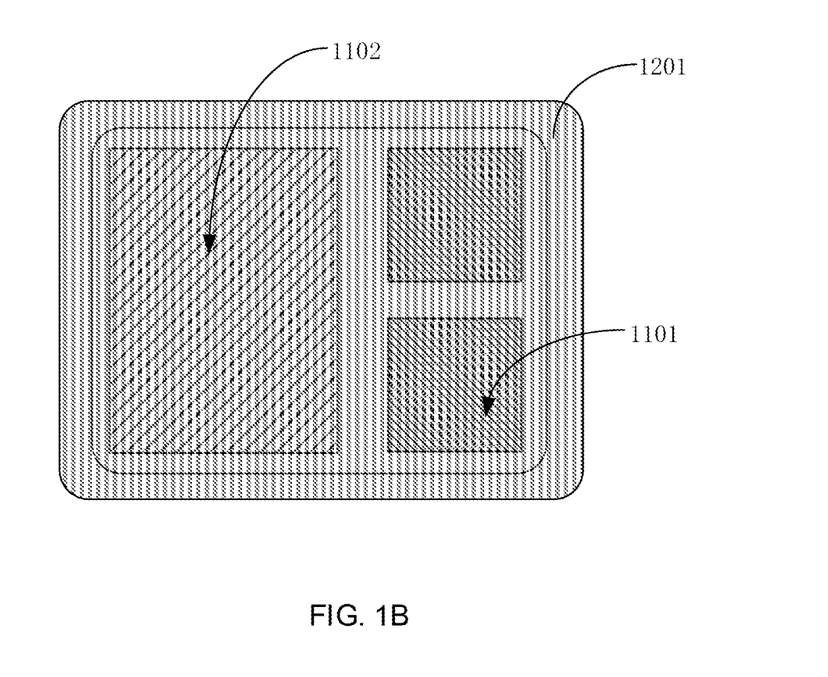
FIG. 1B is a plan view illustrating the relative positions of the adsorption layer and the inductor of the semiconductor device of FIG. 1A.

FIG. 1B is a plan view illustrating the relative positions of the adsorption layer 1201 and the inductor 1102 of the semiconductor device of FIG. 1A. As shown in FIG. 1B, the adsorption layer 1201 on the top substrate 120 completely overlaps the front-end device (including the MEMS device 1101 and the inductor 1102) on the bottom substrate 110.

The adsorption layer 1201 is typically made of titanium which is a conductive material. As a result, the overlapping of the inductor 1102 and the adsorption layer 1201 may result in a coupling effect between the inductor 1102 and the adsorption layer 1201, thereby causing a quality factor of the inductor 1102 in the cavity 130 to decrease. Accordingly, the stability and yield of the semiconductor device may deteriorate due to the decrease in the quality factor of the inductor 1102.

Next, a semiconductor device according to an exemplary embodiment will be described with reference to FIGS. 2A and 2B. Specifically, FIG. 2A is a cross-sectional view of the semiconductor device according to the exemplary embodiment, and FIG. 2B is a plan view illustrating the relative positions of the adsorption layer and the inductor of the exemplary semiconductor device of FIG. 2A.

Figure 2A:
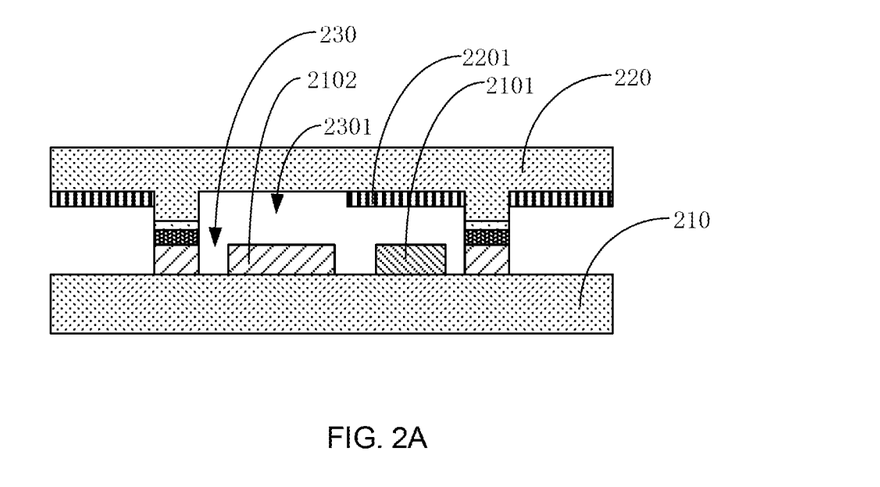
FIG. 2A is a cross-sectional view of a semiconductor device according to an embodiment.
Figure 2B:
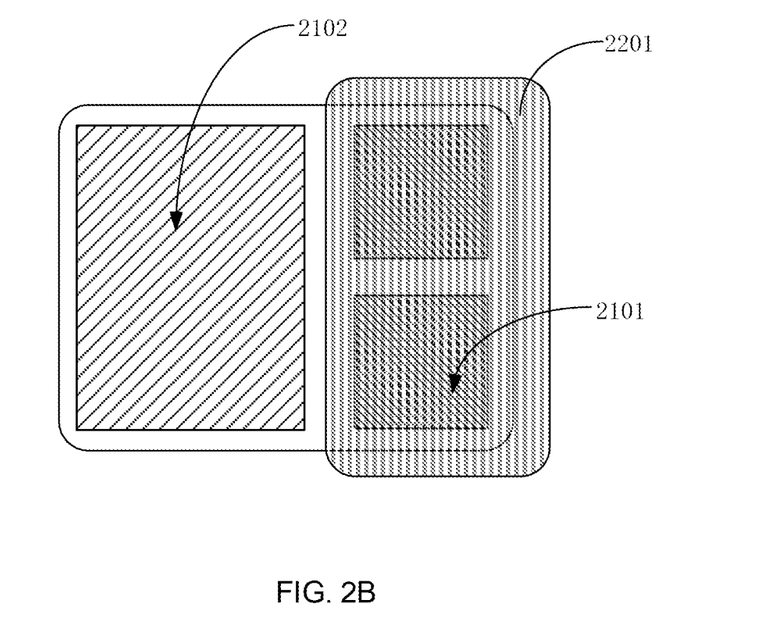
FIG. 2B is a plan view illustrating the relative positions of the adsorption layer and the inductor of the semiconductor device of FIG. 2A.

Referring to FIG. 2A, the semiconductor device includes a bottom substrate 210 on which a MEMS device 2101 and an inductor 2102 are disposed. The MEMS device 2101 and the inductor 2102 collectively constitute a front-end device. In some embodiments, the front-end device may include the MEMS device 2101, the inductor 2102, as well as other components.

The semiconductor device also includes a top substrate 220 bonded to the bottom substrate 210, so as to form a cavity 230 between the top substrate 220 and the bottom substrate 210. As shown in FIG. 2A, the front-end device including the MEMS device 2101 and the inductor 2102 is disposed in the cavity 230.

The semiconductor device further includes an adsorption layer 2201 disposed on a portion of the top substrate 220 facing the front-end device. As shown in FIG. 2A, the adsorption layer 2201 and the inductor 2102 do not overlap in a vertical direction. The vertical direction is a direction that is perpendicular to a top surface of the front-end device on the bottom substrate 210.

FIG. 2B is a plan view illustrating the relative positions of the adsorption layer 2201 and the inductor 2102 of the semiconductor device of FIG. 2A. As shown in FIG. 2B, the adsorption layer 2201 and the inductor 2102 do not overlap in the vertical direction. Instead, the adsorption layer 2201 only overlaps with the MEMS device 2101.

The adsorption layer 2201 may be made of titanium or any other suitable material. The adsorption layer 2201 can absorb gases that may be released by the bottom/top substrates 210/220 into the cavity 230, so that the cavity 230 can enter into a vacuum-like state.

In some embodiments, the front-end device may further include other components such as an application specific integrated circuit (ASIC) device, in addition to the MEMS device 2101 and the inductor 2102.

Figure 3A:
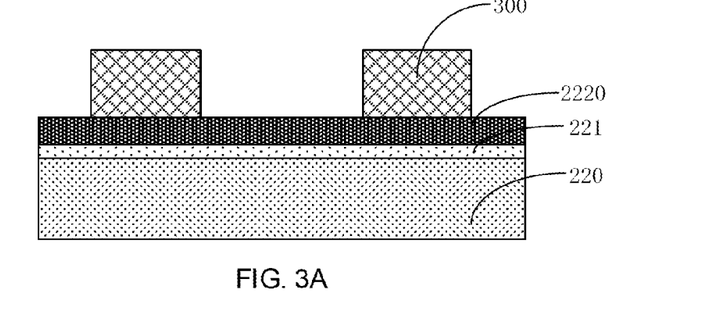
FIGS. 3A, 3B, 3C, 3D, 3E, 3F, 3G, 3H, 3I, and 3J depict cross-sectional views of a semiconductor device at different stages of manufacture according to an exemplary method of manufacturing the semiconductor device.
Figure 3B:
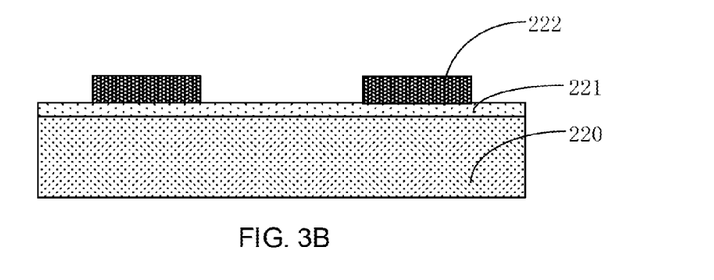
Figure 3C:
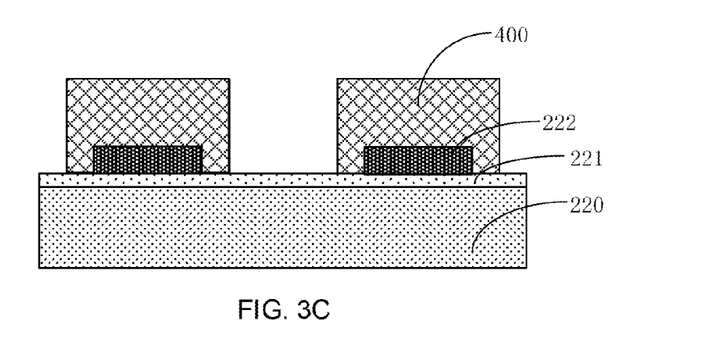
Figure 3D:
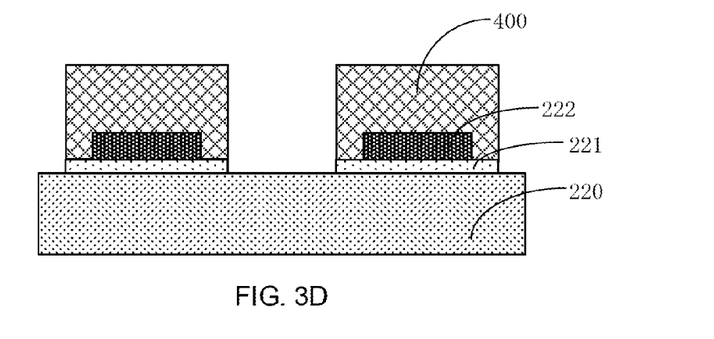
Figure 3E:
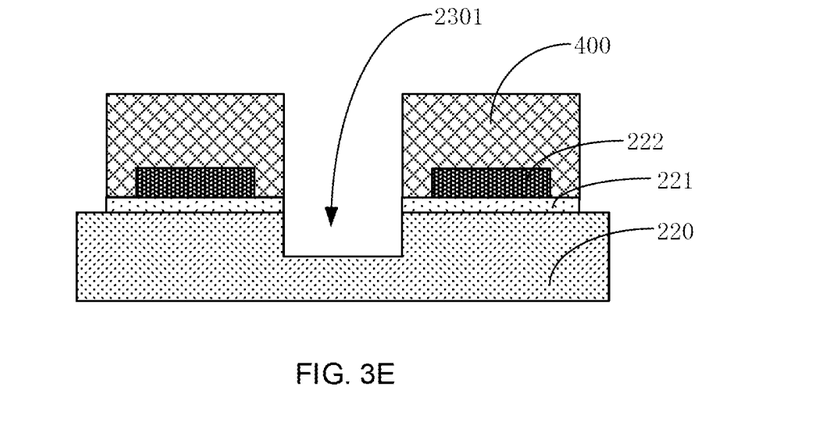

As shown in FIG. 2A, a trench 2301 is formed on the top substrate 220 facing the front-end device. The trench 2301 constitutes a part of the cavity 230. The adsorption layer 2201 is disposed on a portion of a bottom surface of the trench 2301. In the example of FIG. 2A, the adsorption layer 2201 is disposed on a portion of a bottom surface of the trench 2301 facing (and overlapping with) the MEMS device 2101. In some other embodiments, the adsorption layer 2201 may be disposed on a sidewall of the trench 2301 in addition to a portion of a bottom surface of the trench 2301 (e.g., as shown in FIG. 3J), so as to increase the gas absorption capability of the adsorption layer 2201. In some alternative embodiments (not shown), the adsorption layer 2201 may be disposed on only a sidewall of the trench 2301. It is note that any configuration/layout of the adsorption layer 2201 is contemplated.

The bottom substrate 210 and the top substrate 220 may be made of commonly-used substrate materials such as silicon. The top substrate 220 primarily serves as a cover for forming the cavity 230.

In the semiconductor device of FIGS. 2A and 2B, since the adsorption layer 2201 and the inductor 2102 do not overlap in the vertical direction, the coupling effect between the adsorption layer 2201 and the inductor 2102 is reduced, thereby increasing the quality factor of the inductor 2102. Accordingly, the stability and yield of the exemplary semiconductor device can be improved. In addition, the vacuum state of the cavity 230 can be maintained by the adsorption layer 2201, thus ensuring the performance of the semiconductor device.

Next, a method of manufacturing a semiconductor device according to an embodiment will be described with reference to FIGS. 3A through 3J and FIG. 4. Specifically, FIGS. 3A, 3B, 3C, 3D, 3E, 3F, 3G, 3H, 3I, and 3J depict cross-sectional views of the semiconductor device at different stages of manufacture according to the exemplary method. FIG. 4 is a flowchart of the exemplary method.

Referring to FIGS. 3A through 3J, the method may include the following steps:

Step A1: A hard mask layer 221 is formed on a top substrate 220, and a bonding material layer 2220 is formed on the hard mask layer 221. A first mask 300 is formed on the bonding material layer 2220, resulting in the structure shown in FIG. 3A.

Next, the bonding material layer 2220 is etched using the first mask 300 to form a bonding layer 222. Specifically, portions of the bonding material layer 2220 that are not covered by the first mask 300 are removed by the etching. The first mask 300 is then removed, resulting in the structure shown in FIG. 3B.

The top substrate 220 may be made of various types of commonly-used substrate materials. For example, the top substrate 220 may be a silicon substrate. The hard mask layer 221 may be made of silicon oxide or any other suitable material. The bonding material layer 2220 (and the bonding layer 222) may be made of germanium (Ge) or any other suitable material. The bonding layer 223 serves to bond the top substrate 220 and the bottom substrate 210 together.

The first mask 300 may be made of a photoresist or any other suitable material. In some embodiments, a photoresist layer is coated on the bonding material layer 2220, and the photoresist layer is then patterned using photolithography to form the first mask 300.

Step A2: A second mask 400 is formed covering the bonding layer 222, resulting in the structure shown in FIG. 3C. An opening of the second mask 400 corresponds approximately to a location of a trench that is formed later, as described in the following steps.

Next, the hard mask layer 221 is etched using the second mask 400, so as to remove the portions of the hard mask layer 221 that are not covered by the second mask 400. The resulting structure is shown in FIG. 3D. The hard mask layer 221 may be etched using dry etching or any other suitable method.

The second mask 400 may be made of a photoresist or any other suitable material. In some embodiments, a photoresist layer is coated over the structure of FIG. 3B, and the photoresist layer is then patterned using photolithography to form the second mask 400.

In some embodiments (not shown), an alignment pattern of the first mask 300 may be etched at the same time when etching the hard mask layer 221. The alignment pattern is typically located on the same layer as the bonding material layer 222, and uses the same material as the bonding material layer 222.

Step A3: The top substrate 220 is etched using the second mask 400 to form a trench 2301, resulting in the structure shown in FIG. 3E. The top substrate 220 may be etched using Deep Reactive Ion Etching (DRIE) or any other suitable method.

Figure 3F:
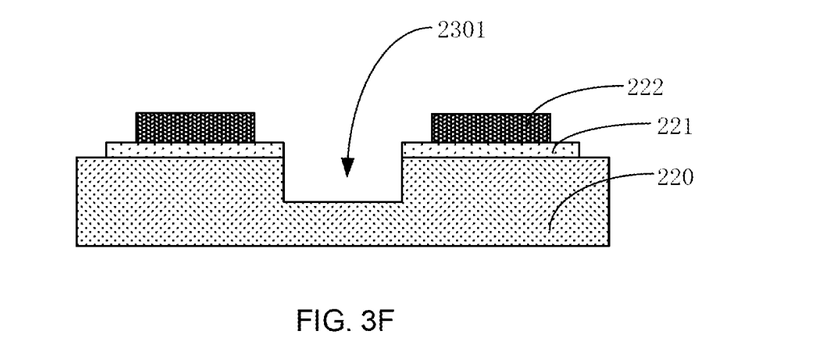
Figure 4:
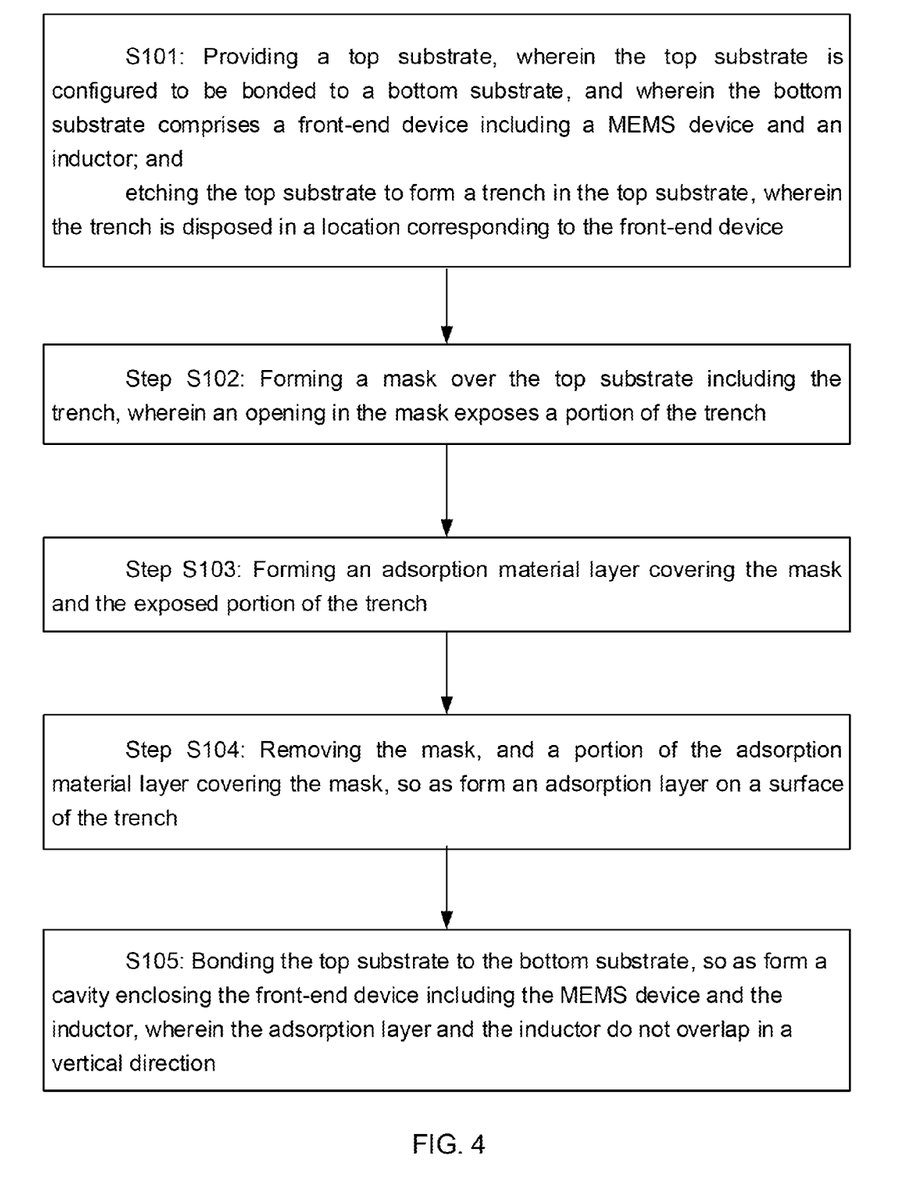
FIG. 4 is a flowchart illustrating a method of manufacturing a semiconductor device according to an embodiment.

The second mask 400 is then removed, resulting in the structure shown in FIG. 3F. The second mask 400 may be removed using a lift-off process or any other suitable method.

The second mask 400 protects the bonding layer 223 during the etching of the top substrate 220 (specifically, during the formation of the trench 2301), thereby ensuring good morphology of the bonding layer 223. If the second mask 400 were absent, the bonding layer 223 may be inadvertently etched during the etching of the top substrate 220, which may then affect the morphology of the bonding material layer 223.

As previously described, the bonding layer 223 serves to bond the top substrate 220 and the bottom substrate 210 together. Accordingly, the bonding yield of the semiconductor device may be improved when the bonding layer 223 has good morphology.

Steps A1 through A3 ensure that the trench 2301 is properly formed (e.g., having a desired shape) in the top substrate 220, thereby improving the yield of the semiconductor device. It is noted that the order of forming the trench 2301 and bonding layer 222 is not limited to the above steps, and may be modified in different ways. For example, in some other embodiments, the trench 2301 may be formed in the top substrate 220 prior to forming the bonding layer 223 on the top substrate 220.

Figure 3G:
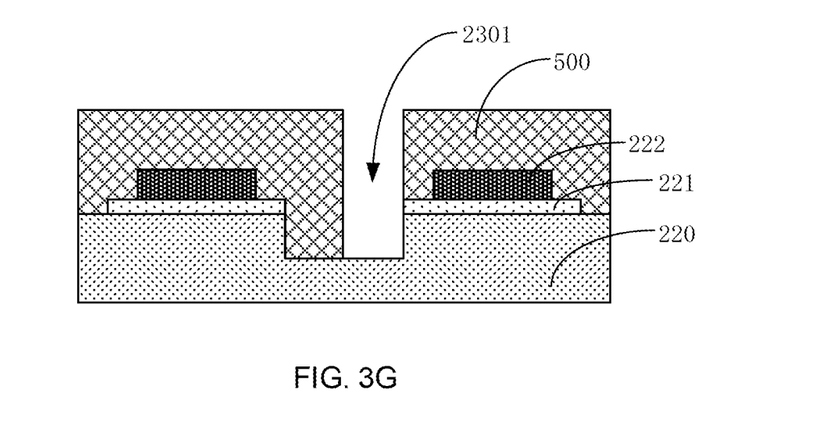

Step A4: A third mask 500 is formed over the structure of FIG. 3F, whereby an opening in the third mask 500 exposes a portion of the trench 2301. The resulting structure is shown in FIG. 3G.

The third mask 500 may be made of a photoresist or any other suitable material. In some embodiments, a photoresist layer is coated over the structure of FIG. 3F, and the photoresist layer is then patterned using photolithography to form the third mask 500.

Step A5: An adsorption material layer 22010 is formed over the structure of FIG. 3G, with the resulting structure shown in FIG. 3H. Specifically, the adsorption material layer 22010 is formed covering the third mask 500 and the exposed portion of the trench 2301.

Figure 3H:
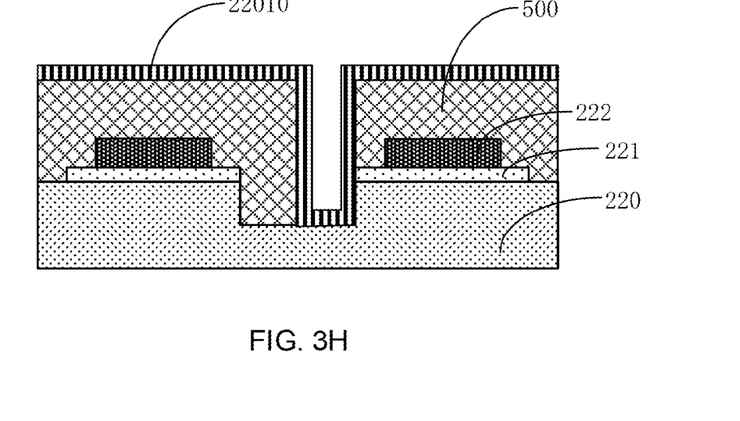

The adsorption material layer 22010 may be made of titanium or any other suitable material.

Figure 3I:
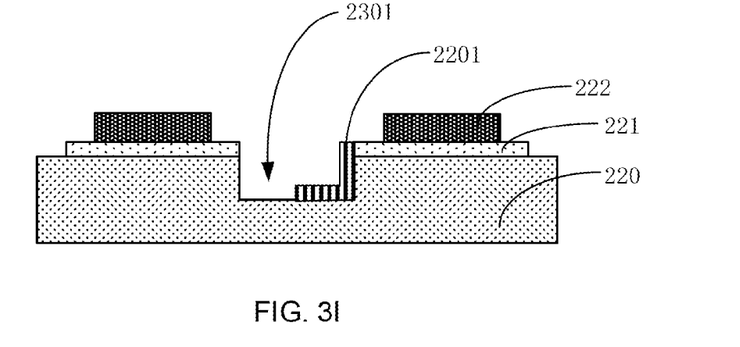
Figure 3J:
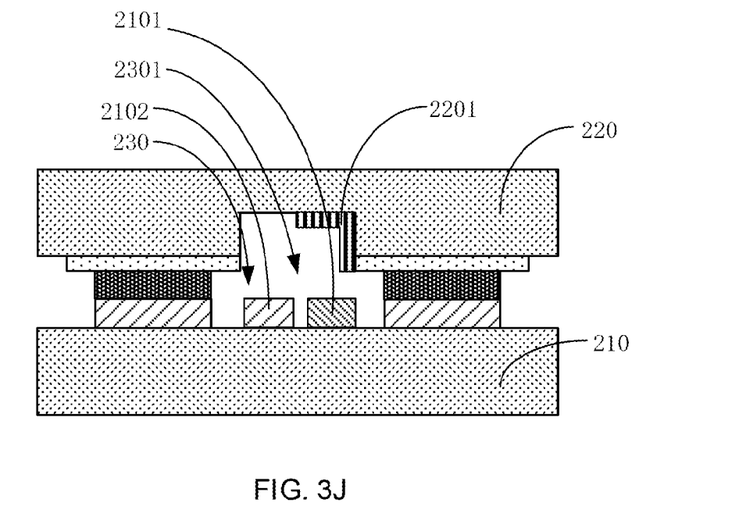

Step A6: The third mask 500, and the portion of the adsorption material layer 22010 covering the third mask 500, are removed using a lift-off process, so as form an adsorption layer 2201 in the trench 2301. The resulting structure is shown in FIG. 3I. As shown in FIG. 3I, the adsorption layer 2201 is formed on a portion of the bottom surface of the trench 2301, and also on a sidewall of the trench 2301.

In some embodiments, other patterns (for example, alignment patterns) may be formed at the same time as the adsorption layer 2201 using the lift-off process.

Step A7: A bottom substrate 210 is provided. A MEMS device 2101 and an inductor 2102 are disposed on the bottom substrate 210. The MEMS device 2101 and the inductor 2102 collectively constitute a front-end device. In some embodiments, the front-end device may include the MEMS device 2101, the inductor 2102, as well as other components. The top substrate 220 is bonded to the bottom substrate 210, so as form a cavity 230 enclosing the front-end device including the MEMS device 2101 and the inductor 2102. The cavity 230 is formed between the top substrate 220 and the bottom substrate 210 in a region corresponding to the trench 2301. As shown in FIG. 3J, the adsorption layer 2201 and the inductor 2102 do not overlap in a vertical direction. Instead, the adsorption layer 2201 only overlaps with the MEMS device 2101.

It is noted that the front-end device including the MEMS device 2101 and the inductor 2102 may be formed on the bottom substrate 210 using various methods known to those skilled in the art. As such, a description of those known methods shall be omitted.

A method of manufacturing a semiconductor device according to an exemplary embodiment has been described above. It is noted that the exemplary method need not be limited to the above-described steps, and that any number of additional steps may be added between Steps A1 through A7, after Step A7, and/or before Step 1.

Using Steps A4 through A7, an adsorption layer and an inductor of a semiconductor device are formed such that they do not overlap in a vertical direction. Accordingly, the coupling effect between the inductor and the adsorption layer can be reduced, and the quality factor of the inductor can be improved, thereby improving the stability and yield of the semiconductor device. In addition, the adsorption layer can maintain a vacuum-like state of a cavity enclosing the inductor and a MEMS device, thereby ensuring the performance of the semiconductor device.

FIG. 4 is a flowchart illustrating a method of manufacturing a semiconductor device according to an exemplary embodiment. The method may include some or all of the steps previously described with reference to FIGS. 3A through 3J (for example, Steps A1 through A7). The method of FIG. 4 may include the following steps:

Step S101: Providing a top substrate, wherein the top substrate is configured to be bonded to a bottom substrate, and wherein the bottom substrate comprises a front-end device including a MEMS device and an inductor; and etching the top substrate to form a trench in the top substrate, wherein the trench is disposed in a location corresponding to the front-end device.

Step S102: Forming a mask over the top substrate including the trench, wherein an opening in the mask exposes a portion of the trench.

Step S103: Forming an adsorption material layer covering the mask and the exposed portion of the trench.

Step S104: Removing the mask, and a portion of the adsorption material layer covering the mask, so as form an adsorption layer on a surface of the trench.

Step S105: Bonding the top substrate to the bottom substrate, so as form a cavity enclosing the front-end device including the MEMS device and the inductor, whereby the adsorption layer and the inductor do not overlap in a vertical direction.

It is noted that the semiconductor device of FIGS. 2A and 2B, or a semiconductor device manufactured using the methods of FIGS. 3A through 3J and/or FIG. 4, may be incorporated into an electronic apparatus. The semiconductor device may be connected to other electronic components. The electronic components may include transistors or other types of electronic components. In some embodiments, the semiconductor device can be formed on a chip that is then incorporated into the electronic apparatus.

The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices. The semiconductor device may also be incorporated into an intermediate product. The intermediate product may be used as stand-alone device, or integrated with other components to form a finished electronic product or device. Since the electronic apparatus includes the semiconductor device, the electronic apparatus therefore inherits its desirable characteristics (for example, improved quality factor, stability, yield, and performance).

Embodiments of a semiconductor device, a method of manufacturing the semiconductor device, and an electronic apparatus including the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

Different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept. Therefore, the inventive concept should not be limited to the foregoing disclosure, but rather construed by the claims appended hereto.

What is claimed is:

1. A semiconductor device comprising:
a bottom substrate, wherein a front-end device including a microelectromechanical systems (MEMS) device and an inductor is disposed on the bottom substrate; and
a top substrate bonded to the bottom substrate so as form a cavity enclosing the front-end device,
wherein the semiconductor device further includes an adsorption layer disposed on a portion of the top substrate facing the front-end device and a sidewall of the cavity, and
wherein the adsorption layer and the inductor do not overlap in a vertical direction, and the adsorption layer and the MEMS device overlap in the vertical direction.

2. The semiconductor device according to claim 1, wherein a trench is formed in the top substrate facing the front-end device, the trench includes a part of the cavity, and wherein the adsorption layer is disposed on a portion of a bottom surface of the trench.

3. The semiconductor device according to claim 2, wherein the adsorption layer is further disposed on a sidewall of the trench.

4. The semiconductor device according to claim 1, wherein the adsorption layer includes titanium.

5. The semiconductor device according to claim 1, wherein the front-end device further includes an application specific integrated circuit (ASIC).

6. A method of manufacturing a semiconductor device, comprising:
providing a top substrate, wherein the top substrate is configured to be bonded to a bottom substrate, and wherein the bottom substrate comprises a front-end device including a microelectromechanical systems (MEMS) device and an inductor;
etching the top substrate to form a trench in the top substrate, wherein the trench is disposed in a location corresponding to the front-end device;
forming a mask over the top substrate including the trench, wherein an opening in the mask exposes a portion of the trench;
forming an adsorption material layer covering the mask and the exposed portion of the trench;
removing the mask, and a portion of the adsorption material layer covering the mask, so as to form an adsorption layer on a surface of the trench; and
bonding the top substrate to the bottom substrate so as form a cavity enclosing the front-end device including the MEMS device and the inductor,
wherein the adsorption layer and the inductor do not overlap in a vertical direction.

7. The method according to claim 6, wherein etching the top substrate to form the trench in the top substrate further comprises:
forming a hard mask layer on the top substrate, a bonding material layer on the hard mask layer, and a first mask on the bonding material layer;
etching the bonding material layer using the first mask to form a bonding layer;
removing the first mask;
forming a second mask covering the bonding layer;
etching the hard mask layer using the second mask, so as to remove portions of the hard mask layer that are not covered by the second mask;
etching the top substrate using the second mask to form the trench in the top substrate; and
removing the second mask.

8. The method according to claim 7, wherein the bonding material layer includes germanium and the hard mask layer includes silicon oxide.

9. The method according to claim 6, wherein the mask includes a photoresist.

10. The method according to claim 6, wherein the adsorption layer includes titanium.

11. The method according to claim 6, wherein the adsorption layer is formed on a portion of a bottom surface of the trench.

12. The method according to claim 11, wherein the adsorption layer is further formed on a sidewall of the trench.

13. The method according to claim 6, wherein the mask, and the portion of the adsorption material layer covering the mask, are removed using a lift-off process.

14. An electronic apparatus comprising:
a semiconductor device and at least one electronic component connected to the semiconductor device, wherein the semiconductor device comprises:
a bottom substrate, wherein a front-end device including a microelectromechanical systems (MEMS) device and an inductor is disposed on the bottom substrate; and
a top substrate bonded to the bottom substrate so as form a cavity enclosing the front-end device,
wherein the semiconductor device further includes an adsorption layer disposed on a portion of the top substrate facing the front-end device, and
wherein the adsorption layer and the inductor do not overlap in a vertical direction, and the adsorption layer and the MEMS device overlap in the vertical direction.

* * * * *